United States Patent
Yun et al.

(10) Patent No.: US 6,584,708 B2
(45) Date of Patent: Jul. 1, 2003

(54) MEMBRANELESS PIEZOELECTRIC/ELECTROSTRICTIVE MICROACTUATOR AND MANUFACTURING METHOD THEREOF

(75) Inventors: Sang Kyeong Yun, Suwon-shi (KR); Sung June Park, Suwon-shi (KR); Dong Hoon Kim, Suwon-shi (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/845,484

(22) Filed: Apr. 30, 2001

(65) Prior Publication Data

US 2001/0015596 A1 Aug. 23, 2001

Related U.S. Application Data

(62) Division of application No. 09/429,828, filed on Oct. 29, 1999, now abandoned.

(30) Foreign Application Priority Data

Jul. 13, 1999 (KR) .................................. 99-28236

(51) Int. Cl.[7] .................................. B41J 20/45
(52) U.S. Cl. .......................................... 36/324
(58) Field of Search .................. 310/328, 311, 310/342, 366, 358, 354, 359, 333, 559, 800; 427/100; 29/25.35; 347/68–72

(56) References Cited

U.S. PATENT DOCUMENTS

| | | | | | |
|---|---|---|---|---|---|
| 4,825,227 | A | * | 4/1989 | Fischbeck et al. | 310/333 |
| 5,433,809 | A | * | 7/1995 | Pies et al. | 156/257 |
| 6,254,223 | B1 | * | 7/2001 | Kim et al. | 347/70 |
| 6,256,849 | B1 | * | 7/2001 | Kim | 216/27 |

* cited by examiner

Primary Examiner—Nestor Ramirez
Assistant Examiner—Karen Addison
(74) Attorney, Agent, or Firm—Darby & Darby

(57) ABSTRACT

The present invention relates to a membraneless piezoelectric/electrostrictive microactuator comprising: a chamber; a chamber plate in which the chamber is formed; a lower electrode formed on the chamber plate and covering the chamber; a bonding layer formed between the chamber plate and the lower electrode and bonding the chamber plate and the lower electrode; a piezoelectric/electrostrictive film formed on the lower electrode and vibrating when electrified; and an upper electrode formed on the piezoelectric/electrostrictive film, and a manufacturing method thereof, which is membraneless so that structure is simple so that manufacturing method is simple and production cost is reduced to effect eventually the productivity improvement, so also which produces effect of reliability and yield ratio improvement as it is membraneless so that there occur no deformation, crack or void at the bonding part of vibration plate and piezoelectric/electrostrictive film.

26 Claims, 3 Drawing Sheets

MEMBRANELESS PIEZOELECTRIC/ ELECTROSTRICTIVE MICROACTUATOR AND MANUFACTURING METHOD THEREOF

This is a division, of application Ser. No. 09/429,828, filed Oct. 29, 1999 now abandoned. Each of these prior applications is hereby incorporated herein by reference, in its entirety.

BACKGROUND OF THE INVENTION

1. Field of the Invention

The present invention relates to a piezoelectric/ electrostrictive microactuator and manufacturing method thereof. In particular, the present invention relates to a piezoelectric/electrostrictive microactuator whose structure is simple because of being membraneless and easy of low voltage driving and also it relates to a manufacturing method of such an actuator.

2. Description of the Prior Art

An ink jet printer head actuator using a piezoelectric substance is usually composed of an infrastructure made of a vibration plate (22) and a chamber (20), a piezoelectric/ electrostrictive film (26) which undergoes mechanical transformation if electricity is applied as the piezoelectric/ electrostrictive film is connected on the vibration plate (22), and electrodes (24) (28) which transmit electricity to the piezoelectric/electrostrictive film (26) as in FIG. 2.

The piezoelectric substance of an actuator has characteristics poling (by which a directionality is given at piezoelectric substance when electric field is applied) when electric field is applied. If electricity is supplied to an upper electrode and a lower electrode formed on and under piezoelectric substance under poling state, the piezoelectric substance located between electrodes undergoes mechanical deformation or vibrates with recycling of transformation and restoration.

In the ink jet printer head, ink is jetted to a record medium as the vibration plate undergoes mechanical transformation thickwise if the piezoelectric substance of actuator vibrates.

Thus in the ink jet printer head, the infrastructure composed of the chamber and the vibration plate is an important factor for the operation of the actuator.

Metal, resin, ceramic etc. are used as material of the chamber plate and the vibration plate of the actuator using the piezoelectric substance.

Ordinarily chamber structure is formed mainly by half etching of wet etching method in case where metal is used as the material; three dimensional structure is formed by injection molding method in case where resin is used as the material; and three dimensional structure is formed by integrated molding of vibration sheet and punching of the sheet in case where ceramic is used as the material.

It is important to supply uniform vibration plate when manufacturing the infrastructure of the chamber and the vibration plate by the methods.

And because the actuator is made by forming a piezoelectric/electrostrictive film on the vibration plate, void may easily be formed between the vibration plate and the piezoelectric/electrostrictive film, and by way of which void there is worry of occurring partial crack.

SUMMARY OF THE INVENTION

The present invention to solve the problem aims to provide a piezoelectric/electrostrictive microactuator of simple structure having no vibration plate by way of direct binding of piezoelectric/electrostrictive film onto a chamber plate done of full etching or punching method, and a manufacturing method thereof.

The present invention to accomplish the purpose features a manufacturing method of a membraneless piezoelectric/ electrostrictive microactator comprising the steps of providing a chamber plate; forming a chamber in the chamber plate; forming a piezoelectric/electrostrictive film separately; forming a lower electrode under the piezoelectric/ electrostrictive film; bonding the chamber plate and the lower electrode using a bonding layer; and forming an upper electrode on the piezoelectric/electrostrictive film.

Also the present invention features a membraneless piezoelectric/electrostrictive microactuator comprising a chamber; a chamber plate in which the chamber is formed; a lower electrode formed on the chamber plate and covering the chamber; a bonding layer formed between the chamber plate and the lower electrode and bonding the chamber plate and the lower electrode; a piezoelectric/electrostrictive film formed on the lower electrode and vibrating when electrified; and an upper electrode formed on the piezoelectric/ electrostrictive film.

DETAILED DESCRIPTION

The present invention will be described in detail.

Metal, ceramic or engineering plastic of specialized resin is used for a chamber plate.

It is preferable to use stainless steel or nickel as for the metal and to use metal oxide or silicon as for the ceramic.

Chamber is formed in a fine pattern in the chamber plate.

It is preferable to form the chamber structure using a punching method or a full etching method through wet etching in case of using a metal for the chamber plate while it is preferable to form the chamber structure using a punching method in case of using a ceramic or an engineering plastic.

Figure 1A:
FIGS. 1a through 1c show a outline of full etching principle.
Figure 1B:
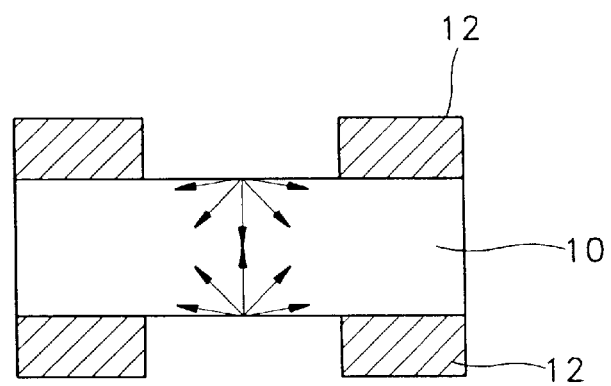
Figure 1C:
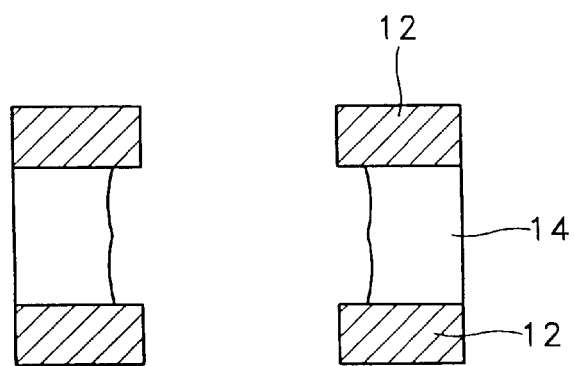
Figure 2:
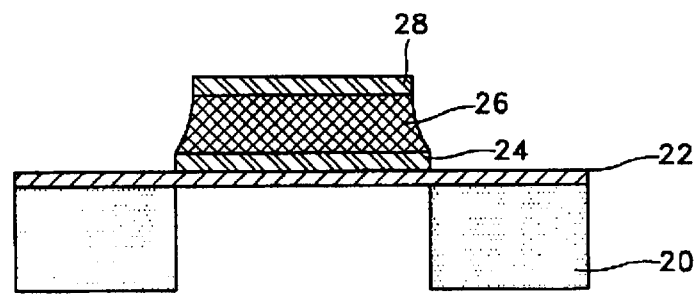
FIG. 2 is a cross section of ordinary structure of conventional piezoelectric/electrostrictive microactuator.

FIGS. 1a through 1c illustrates a principle of full etching used to form the chamber structure in a metal plate.

Wet etching is performed after forming a etching mask (12) symmetrically on both side of the metal plate (10). In wet etching, etching takes place isotropically as shown by arrows in FIG. 1b; and the chamber structure is obtained where a surface of chamber (14) formed by isotropic etching from both sides is nearly a perpendicular type.

A piezoelectric/electrostrictive film to be bound with the chamber plate is separately formed whence it is preferable to form the piezoelectric/electrostrictive film in 15–300 µm thick.

Piezoelectric/electrostrictive ceramic, polyvinylidene fluoride {PVDF} or a mixture of these is used as for the material for the piezoelectric/-electrostrictive film.

As for the piezoelectric/electrostrictive ceramic, it is usual practice to form the piezoelectric/electrostrictive film by heat treatment after forming the piezoelectric/ electrostrictive film by screen printing etc. after making the piezoelectric/electrostrictive ceramic in the form of paste.

A polymer PVDF having piezoelectric/electrostrictive characteristics is used by making it in film type or by buying it in a film type.

As the piezoelectric/electrostrictive ceramic is excellent in piezoelectricity but low of formalizability is low, while PVDF is excellent in formalizability but low of piezoelectricity, a mixture of these two may be used.

It is usual practice in manufacturing the mixture to take piezoelectric/electrostrictive ceramic powder, PVDF and a small quantity of binder into organic solvent of toluene, hexanol etc., uniformly mix by agitating or refluxing, vaporize the solvent and dry the product.

Whence difference arises in methodibility according to the mixing ratio of the piezoelectric/electrostrictive ceramic and PVDF. If the content of PVDF increases, the methodibility is enhanced but piezoelectricality loss is accompanied by decrease of the content of the piezoelectric/ electrostrictive ceramic; while if the content of PVDF decreases, the piezoelectricability is enhanced but the methodibility is lowered. Wherefore the mixing ratio is selected to use according to the desired characteristics of the piezoelectric/electrostrictive microactuator.

The mixture of the piezoelectric/electrostrictive ceramic and PVDF is processed into film by a rolling method etc.

The piezoelectric/electrostrictive film thus formed plays a role as a vibration plate in the membraneless piezoelectric/ electrostrictive microactuator of the present invention. Wherefore the piezoelectric/electrostrictive film vibrates as it is actuated if electricity is supplied to the piezoelectric/ electrostrictive film as electricity is put on upper and lower electrodes.

The lower electrode is formed under the formed piezoelectric/electrostrictive film. The lower electrode is formed by the method of sputtering or screen printing etc. using the materials of gold (Au), silver (Ag), aluminum (Al), nickel (Ni), platinum (Pt) etc.

Whence it is preferable to form the lower electrode 1–5 μm thick.

A binding layer is formed on the chamber plate formed of chamber in a fine pattern or on the lower electrode formed on the piezoelectric/electrostrictive film. Whence it is preferable to form the binding layer 1–30 μm thick while it is particularly preferable to form the binding layer 1–10 μm thick.

An conductive adhesive is used as for the binding layer material for which adhesive it is preferable to use silver paste or conductive resin such as conductive epoxy or polymers.

The binding layer is formed by coating the conductive adhesive on the chamber using the screen printing, spray method etc.

The chamber plate and the piezoelectric/electrostrictive film are bound together by laying the piezoelectric/ electrostrictive film on the chamber plate and then thermally treating the piezoelectric/electrostrictive film.

At the time of binding, a definite pressure may be given using a jig for use in binding so that the binding be uniform.

The piezoelectric/electrostrictive film thus bound to the chamber plate will be used after etching to a desired pattern as required or may be used as it is in the present state without etching.

The bond layer is exposed on chamber part after binding in case where the bond layer is formed under the lower electrode, it will be used after removing the exposed bond layer or may be used as it is with the bonding layer not removed. The remaining bond layer not removed plays a role as the vibration plate.

The upper electrode is formed in a definite pattern on the piezoelectric/electrostrictive film. The upper electrode is formed also by the method of sputtering or screen printing etc. using the materials of gold (Au), silver (Ag), aluminum (Al), nickel (Ni), platinum (Pt) etc.

The piezoelectric/electrostrictive microactuator manufactured by the method comprises a chamber; a chamber plate where the chamber is formed; a lower electrode formed to cover the chamber in the chamber plate; a binding layer formed between the chamber plate and the lower electrode so as to bind the chamber plate and the lower electrode; a piezoelectric/electrostrictive film which is formed on the lower electrode so as to vibrate when electrified; and an upper electrode which is formed on the piezoelectric/ electrostrictive film.

The piezoelectric/electrostrictive microactuator manufactured by the method of the present invention is membraneless, so that the structure and manufacturing method are simple and production cost is reduced to effect eventually the productivity improvement.

Also it produces effect of reliability and yield ratio improvement as it is membraneless so that deformation, crack or void at the binding part of the vibration plate and the piezoelectric/electrostrictive film is not occurred.

Now the present invention will be described in detail by the following examples. But the following application examples are only illustrations of the present invention and do not confine the extent of the present invention.

Figure 3:
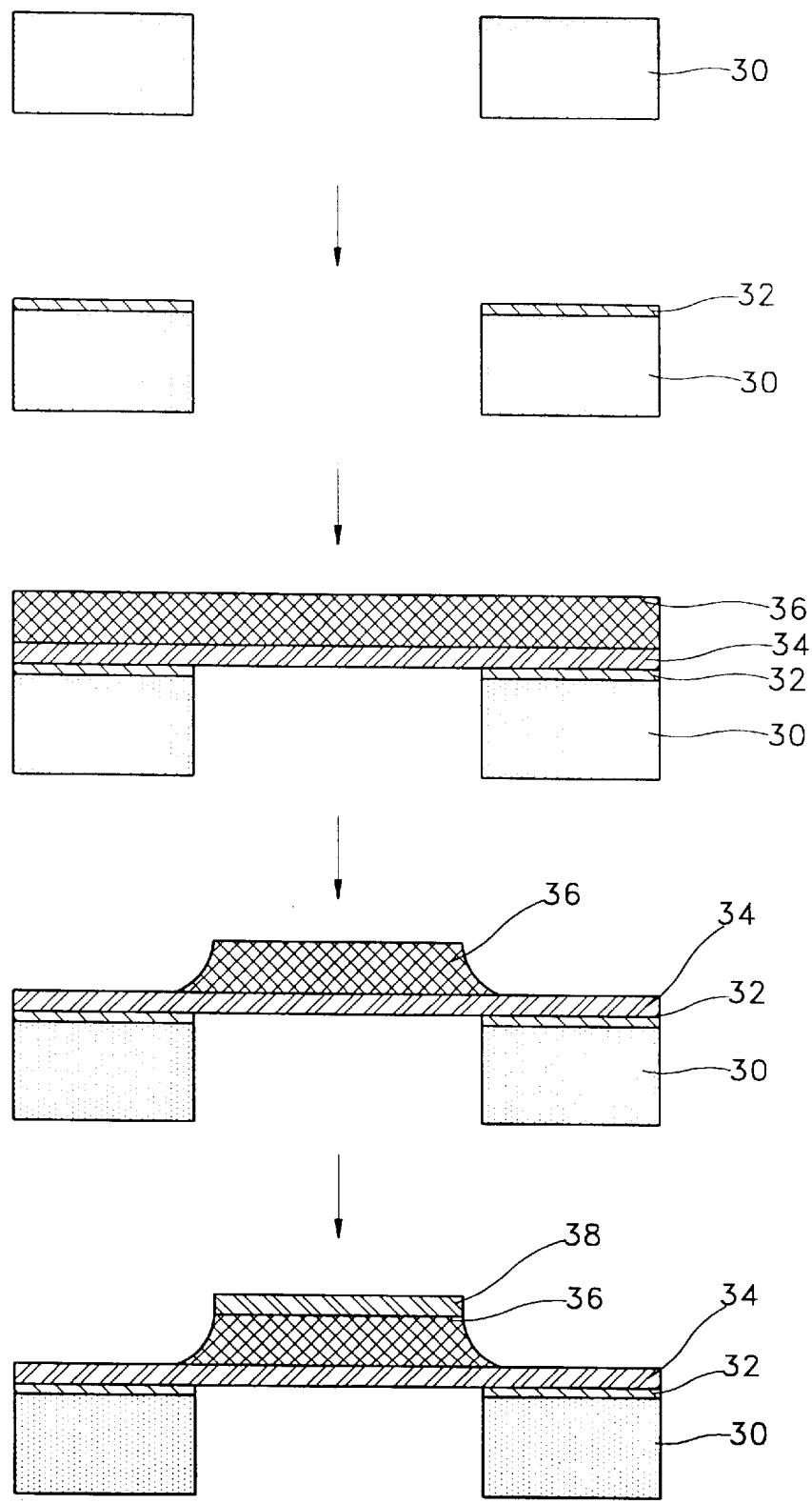
FIG. 3 is a diagram of an embodiment of manufacturing method of a membraneless piezoelectric/electrostrictive microactuator according to the present invention.

FIG. 3 is a flow diagram showing an embodiment of a manufacturing method of a piezoelectric/electrostrictive microactuator.

Firstly etching or punching method is carried out on a substrate plate to form a chamber plate (30) where a chamber is formed. A binding layer (32) is formed on the chamber plate (30). A piezoelectric/electrostrictive film (36) which is separately formed is laid on the binding layer (32) and where is formed a lower electrode (34); then it is thermally treated to bond the bond layer (32) and the piezoelectric/ electrostrictive film (36).

The piezoelectric/electrostrictive film (36) is patterned by etching which the piezoelectric/electrostrictive film has been bonded to the chamber plate (30).

The membraneless piezoelectric/electrostrictive microactuator plate is completed by forming an upper electrode (38) on the piezoelectric/electrostrictive film (36) which is patterned.

Figure 4:
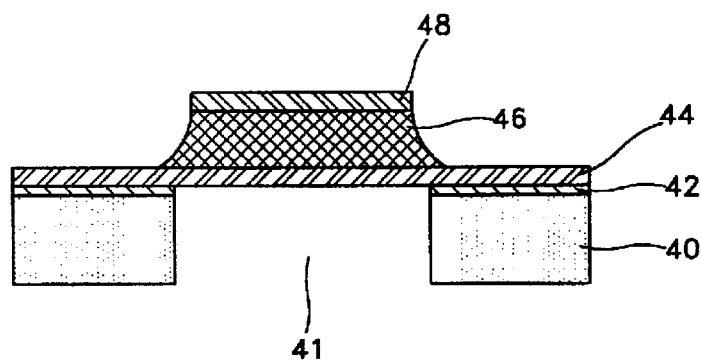
FIG. 4 is a cross section showing another embodiment of a membraneless piezoelectric/electrostrictive microactuator according to the present invention.

FIG. 4 is an outline view of an embodiment of a membraneless piezoelectric/electrostrictive microactuator according to the present invention.

A microactuator shown in FIG. 4 comprises a chamber plate (40) where a chamber (41) is formed; a bond layer (42) fomed on the chamber plate (40); a lower electrode (44) formed on the bond layer (42); a piezoelectric/ electrostrictive film (46) formed on the lower electrode (44) to be patterned; and an upper electrode (48) formed on the piezoelectric/electrostrictive film (46).

Figure 5:
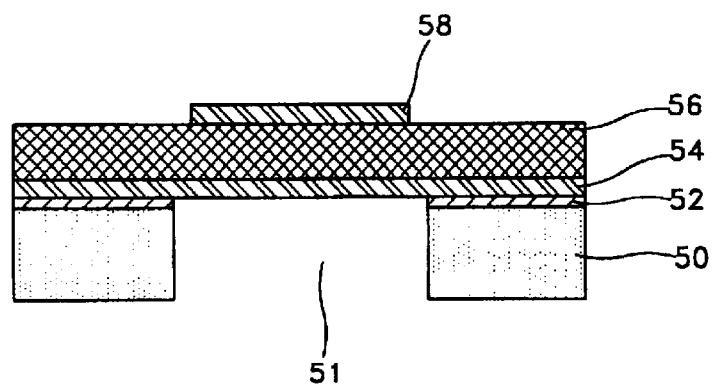
FIG. 5 is a cross section showing another embodiment of a membraneless piezoelectric/electrostrictive microactuator according to the present invention.

FIG. 5 is an outline view of another embodiment of a membraneless piezoelectric/electrostrictive microactuator according to the present invention.

A microactuator shown in FIG. 5 comprises a chamber plate (50) where a chamber (51) is formed; a bond layer (52) fomed on the chamber plate (50); a lower electrode (54) formed on the bond layer (52); a piezoelectric/electrostrictive film (56) formed on the lower electrode (54); and an upper electrode (58) formed in a designated pattern on the piezoelectric/electrostrictive film (56).

What is claimed is:

1. Membraneless piezoelectric/electrostrictive microactuator comprising:
   a chamber plate in which a chamber is formed by a removed region having a predetermined pattern;
   a lower electrode covering said chamber and having a surface overlying the chamber plate outside the removed region;
   a bonding layer bonding said chamber plate outside said removed region and said lower electrode surface;
   a piezoelectric/electrostrictive film formed on said lower electrode and vibrating towards and away from the lower electrode when electrified; and
   an upper electrode formed on a portion of said piezoelectric/electrostrictive film overlying substantially the entire removed region, and cooperating with said lower electrode to electrify said piezoelectric/electrostrictive film, by polarizing it along its thickness.

2. Membraneless piezoelectric/electrostrictive microactuator in claim 1, wherein said chamber plate is made of metal.

3. Membraneless piezoelectric/electrostrictive microactuator of claim 2, wherein said metal is stainless steel or nickel.

4. Membraneless piezoelectric/electrostrictive microactuator in claim 1, wherein said chamber plate is made of ceramic.

5. Membraneless piezoelectric/electrostrictive microactuator in claim 4, wherein said ceramic is metal oxide or silicon.

6. Membraneless piezoelectric/electrostrictive microactuator in claim 1, wherein said chamber plate is made of plastic.

7. Membraneless piezoelectric/electrostrictive microactuator in claim 1, wherein said boding layer is made of conductive adhesive.

8. Membraneless piezoelectric/electrostrictive microactuator in claim 7, wherein said conductive adhesive is silver paste, or conductive resin such as conductive epoxy or polymers.

9. Membraneless piezoelectric/electrostrictive microactuator in claim 1, wherein said bonding layer is 1–30 $\mu$m thick.

10. Membraneless piezoelectric/electrostrictive microactuator in claim 2, wherein said bonding layer is 1–10 $\mu$m thick.

11. Membraneless piezoelectric/electrostrictive microactuator in claim 1, wherein the material of said piezoelectric/electrostrictive film is piezoelectric/electrostrictive ceramic, polyvinylidene fluoride, or a mixture of substance of said piezoelectric/electrostrictive ceramic and polyvinylidene fluoride.

12. Membraneless piezoelectric/electrostrictive microactuator in claim 1, wherein said piezoelectric/electrostrictive film is 15–300 $\mu$m thick.

13. Membraneless piezoelectric/electrostrictive microactuator in claim 1, wherein said lower electrode is 1–5 $\mu$m thick.

14. A membraneless piezoelectric/electrostrictive microactuator comprising:
   a chamber plate having a removed region with a predetermined pattern to form a chamber;
   a lower electrode covering the chamber and having a surface overlying the chamber plate outside the removed region;
   a bonding layer bonding the chamber plate outside the removed region and the lower electrode surface;
   a piezoelectric/electrostrictive film formed to overlay the lower electrode, and vibrating in a vertical polarization direction towards and away from the lower electrode when electrified; and
   an upper electrode formed on a portion of the piezoelectric/electrostrictive film overlying substantially the entire removed region and cooperating with the lower electrode to electrify the piezoelectric/electrostrictive film by polarizing it along its thickness;
   wherein, the piezoelectric/electrostrictive film is caused to remain on a region overlying substantially the entire removed region of the chamber plate by etching the region outside the removed region of the chamber plate.

15. The membraneless piezoelectric/electrostrictive microactuator in claim 14, wherein the chamber plate is made of metal.

16. The membraneless piezoelectric/electrostrictive microactuator claim 15, wherein the metal is stainless steel or nickel.

17. The membraneless piezoelectric/electrostrictive microactuator in claim 14, wherein the chamber plate is made of ceramic.

18. The membraneless piezoelectric/electrostrictive microactuator in claim 17, wherein the ceramic is metal oxide or silicon.

19. The membraneless piezoelectric/electrostrictive microactuator in claim 14, wherein the chamber plate is made of engineering plastic.

20. The membraneless piezoelectric/electrostrictive microactuator in claim 14, wherein the bonding layer is made of conductive adhesive.

21. The membraneless piezoelectric/electrostrictive microactuator in claim 20, wherein the conductive adhesive is silver paste, or conductive resin such as conductive epoxy or polymers.

22. The membraneless piezoelectric/electrostrictive microactuator in claim 14, wherein the bonding layer is 1–30 $\mu$m thickness.

23. The membraneless piezoelectric/electrostrictive microactuator in claim 14, wherein the bonding layer is 1–10 $\mu$m thickness.

24. The membraneless piezoelectric/electrostrictive microactuator in claim 14, wherein the piezoelectric/electrostrictive film is selectively made of a piezoelectric/electrostrictive ceramic, a polyvinyliden fluoride, or a mixture of the piezoelectric/electrostrictive film and the polyvinyliden fluoride.

25. The membraneless piezoelectric/electrostrictive microactuator in claim 14, wherein the piezoelectric/electrostrictive film is 15–300 $\mu$m thickness.

26. The membraneless piezoelectric/electrostrictive microactuator in claim 14, wherein the lower electrode is 1–5 $\mu$m thickness.

* * * * *